United States Patent
Aoyama

[11] Patent Number: 5,335,199
[45] Date of Patent: Aug. 2, 1994

[54] MULTIPORT MEMORY
[75] Inventor: Keizo Aoyama, Kanagawa, Japan
[73] Assignee: Fujitsu Limited, Kawasaki, Japan
[21] Appl. No.: 853,788
[22] Filed: Mar. 19, 1992
[30] Foreign Application Priority Data
  Mar. 19, 1991 [JP] Japan .................. 3-55044
[51] Int. Cl.[5] .................................... G11C 13/00
[52] U.S. Cl. ....................... 365/230.05; 365/189.04
[58] Field of Search .............. 365/230.01, 230.04, 365/230.05, 189.01, 189.04

[56] References Cited
U.S. PATENT DOCUMENTS

| | | | |
|---|---|---|---|
| 4,858,190 | 8/1989 | Yamaguchi et al. | 365/189.05 |
| 4,984,204 | 1/1991 | Sato et al. | 365/189 |
| 5,053,652 | 10/1991 | Sato et al. | 307/530 |
| 5,177,706 | 1/1993 | Shinohara et al. | 365/189.04 |

FOREIGN PATENT DOCUMENTS

| | | |
|---|---|---|
| 0325105 | 7/1989 | European Pat. Off. . |
| 3906895 | 2/1990 | Fed. Rep. of Germany . |
| 1-296486 | 11/1989 | Japan . |
| 2-3164 | 1/1990 | Japan . |

OTHER PUBLICATIONS
Ser. No. 07/840,127, Feb. 24, 1992, Keizo Aoyama.
European Search Report, EP 92104783.3.

Primary Examiner—Terrell W. Fears
Attorney, Agent, or Firm—Staas & Halsey

[57] ABSTRACT

A multiport memory that allows simultaneous reading and/or writing to the same memory cells by shorting selected bit lines with other bit lines of cells whose row address from each port match.

33 Claims, 14 Drawing Sheets

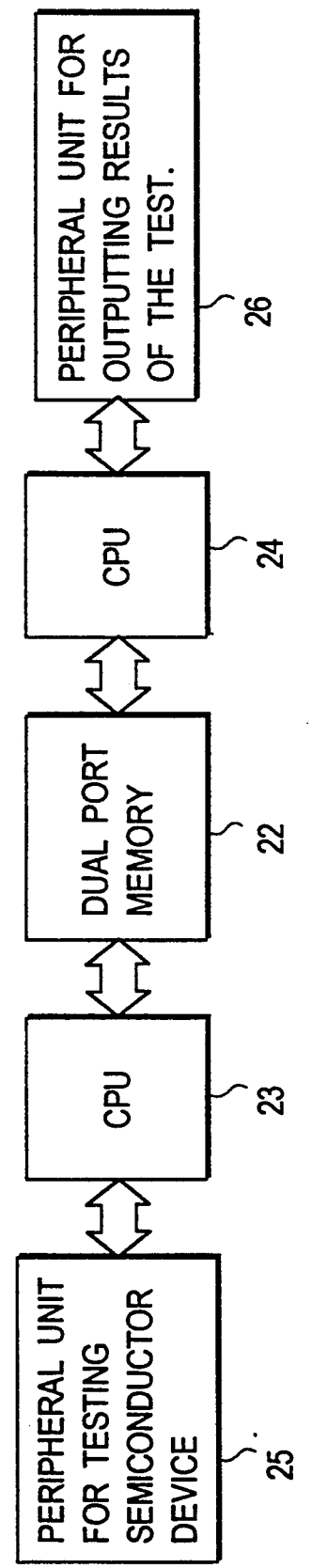

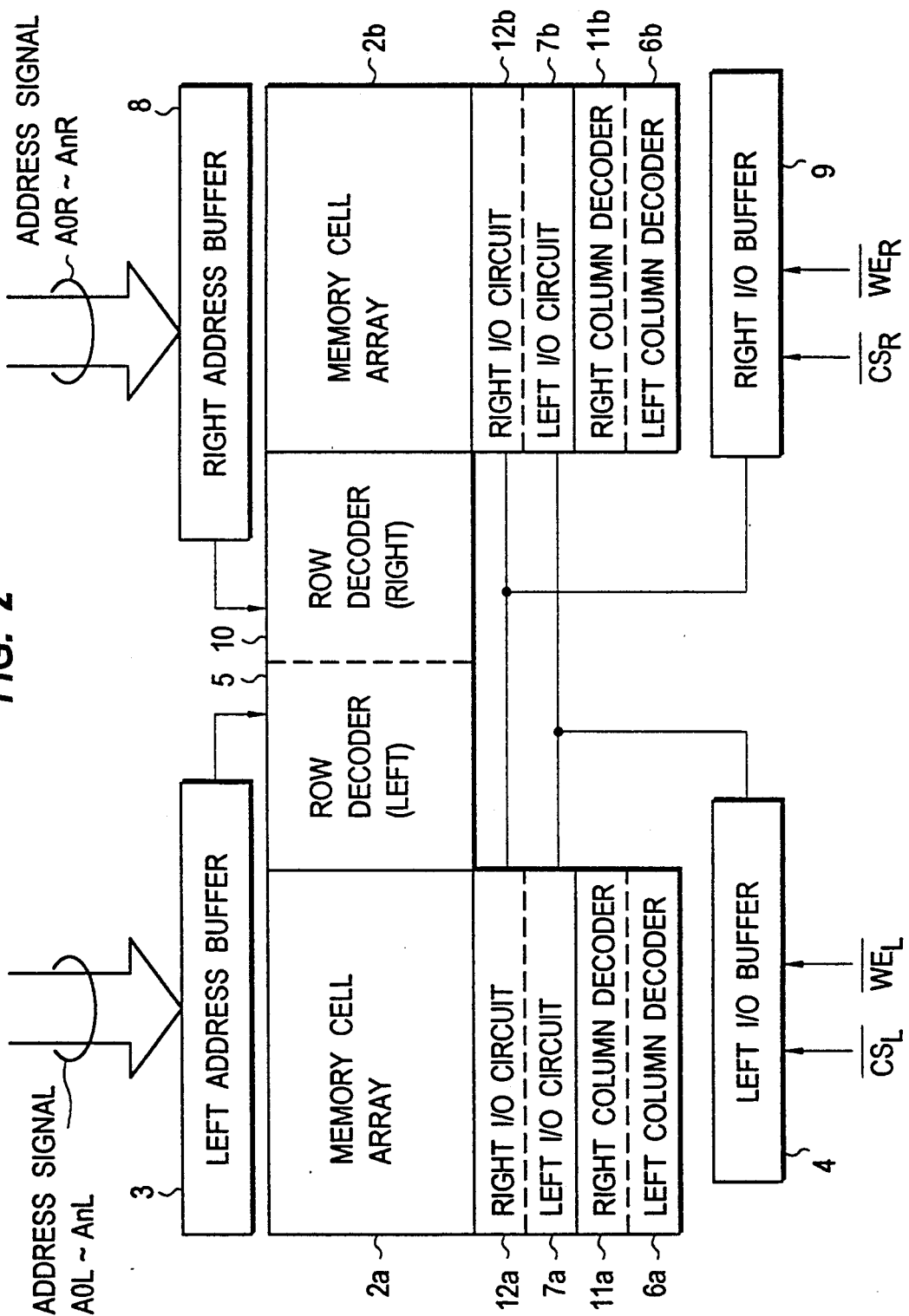

FIG. 7(a)
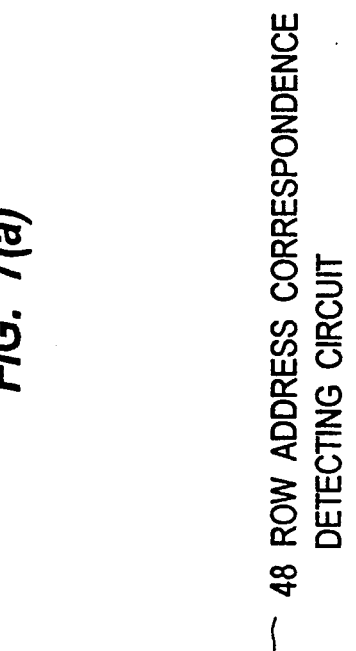
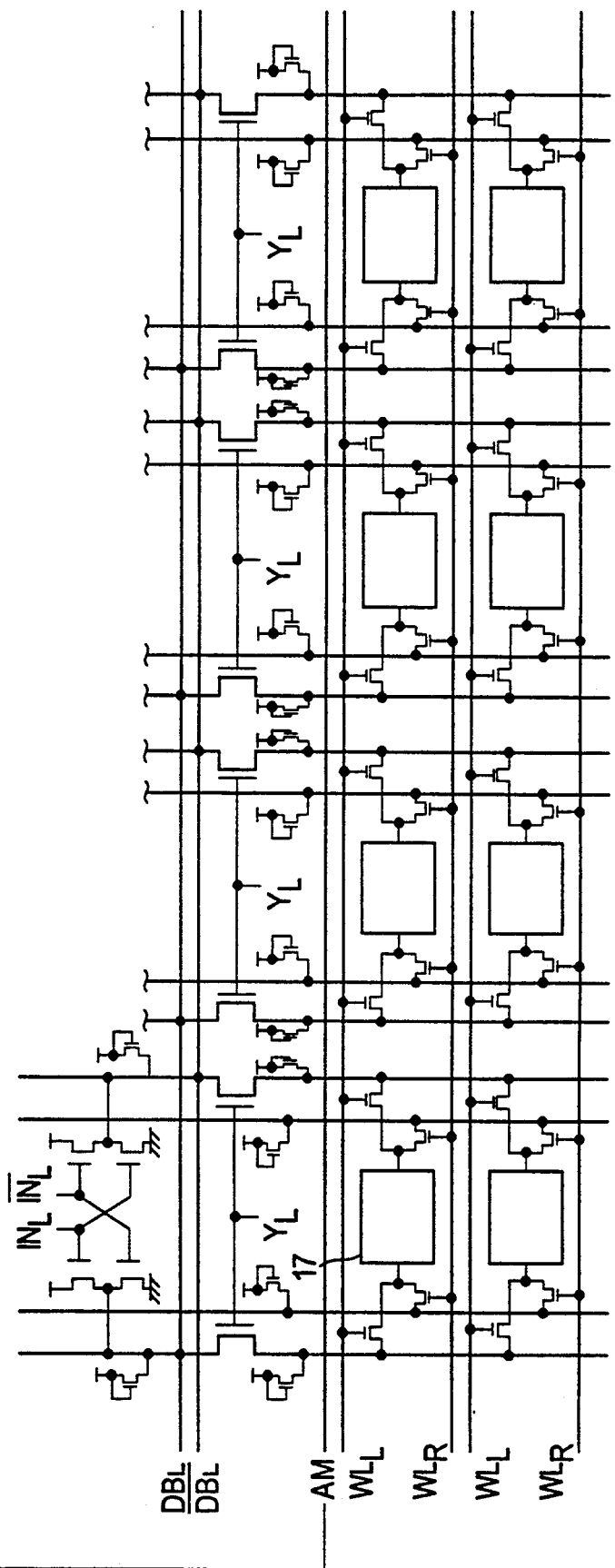
48 ROW ADDRESS CORRESPONDENCE DETECTING CIRCUIT

MULTIPORT MEMORY

BACKGROUND OF THE INVENTION

The present invention is intended to prevent erroneous data writing of a multiport memory such as a so-called dual-port memory, etc. and enhance reliability of the data writing. The background of the advent of multiport memory will be explained first.

In a well known conventional semiconductor memory, an attempt to share the processing with each CPU by connecting a pair of CPUs to only one semiconductor memory requires connection between each CPU and only one semiconductor memory with a data bus line for sending or receiving information. However, if the data bus line is used in common from a plurality of CPUs, while one CPU sends or receives data from a semiconductor memory, the other CPU naturally cannot send or receive data from this semiconductor memory. Therefore, even when a plurality of CPUs are connected to an ordinary semiconductor memory, it has never been possible to simultaneously connect or allow access by a plurality of CPUs to the semiconductor memory for simultaneous data sending and receiving.

A multiport memory to which the present invention is applied enables such simultaneous data sending and receiving to a plurality of CPUs which cannot be realized with a conventional semiconductor memory. Namely, a multiport memory has a plurality of ports for only one memory cell array and connect CPUs to respective ports in order to enable the shared processing by each CPU. A multiport memory in which a total of two ports, one on the left side of memory cell array and one on the right side thereof, are provided is particularly called a dual-port memory which is used most frequently.

DESCRIPTION OF THE RELATED ART

A multiport memory will be explained in more detail.

FIG. 1 is a block diagram of an application example of an ordinary dual-port memory. In FIG. 1, a dual-port memory 22 has right and left ports not illustrated and the left port is connected with a CPU 23, while the right port with a CPU 24. The CPU 23 is connected a peripheral apparatus 25 for metering and the CPU 24 to a peripheral apparatus 26 for outputting a result of metering.

As example of enjoying the effect of high speed processing by dual-port memory a, test of semiconductor memory can be considered. For example, in the case of executing a test of a newly produced semiconductor memory, if defective cells are previously detected in memory cell array of a semiconductor memory, each cell must be checked sequentially while jumping such defective cells, but it is important, for completing the test as quickly as possible, that the test should be continued only for the normal cells while jumping the defective cells and such two kinds of tasks are continued simultaneously. In this case, it is instructed that the defective cells are not tested by the peripheral apparatus 25 used for the metering and this instruction is sent to the dual-port memory 22 for the writing operation through the CPU 23. On the other hand, information stored in the dual-port memory 22 is read and the test result of cells can be outputted from the peripheral apparatus 26 used for outputting the result of metering through the CPU 24. In this case, the dual-port memory 22 generates a busy signal in order to stop the one CPU which has delayed to issue an instruction so that it is inhibited when writing from the left port and reading from the right port are conducted simultaneously if the writing requirements and the reading requirements are generated for the same address. But in another case, in other words, accesses to each port are not for the same address.

So that above-mentioned dual-port memory is capable of by far higher speed access than the conventional semiconductor memory apparatus, in which one data bus line is shared by two CPUs, and one of the two CPUs is to be transferred data to the memory cells.

A conventional dual-port memory has been summarized as explained above.

Next, this dual-port memory 22 will be explained in further detail with reference to FIG. 2. FIG. 2 is a block diagram for explaining a well known dual-port memory. In FIG. 2, a memory cell array 2a, 2b operating as the memory media in the dual-port memory is formed by many SRAMs (Static Random Access Memory) connected with many row selecting lines (word lines) and column selecting lines (bit lines) not illustrated. Moreover, a dual-port memory has two row selecting lines (word lines) and two column selecting lines (bit lines) corresponding to the right and left ports. The right column bit lines are connected to the right decoders 11a, 11b and the left bit lines to the left column decoders 6a, 6b, while the right word lines are connected to the right decoder 10 and the left word line to the left decoder 5. In addition, a left I/O buffer 4 is connected to the left decoders 6a, 6b for the data input through the left I/O circuits 7a, 7b. In the same manner, the right I/O buffer 9 is connected to the right decoders 11a, 11b for the data input through the right I/O circuits 12a, 12b. Moreover, an address signal is supplied to a right row decoder 10 and right column decoders 11a, 11b through a right address buffer 8 and is also supplied to the left row decoder 5 and left column decoders 6a, 6b through the left address buffer 3. A memory cell array which may be housed in the non-separated area is divided into the cell arrays 2a, 2b and the right row decoder 10 and the left row decoder 5 are provided between such arrays 2a, 2b in order to simply improve the access rate of the memory as a whole on the specification. Namely, since an access rate of the memory as a whole is controlled by the access rate to the furthest memory cell from the decoder, it is required to provide all memory cells as nearest as possible to the decoder. Moreover, the structure mentioned above is effective for solving a problem that a load on the word lines becomes heavier increase in the length of the distance between the row corresponding to an decoder and word line and thereby reliability of read and write operation of information from or to the memory cell is lowered.

In addition, a part of the circuit in the memory cell arrays 2a, 2b will be explained in more detail with reference to FIG. 3.

In FIG. 3, a plurality of right bit line pairs ($BL_R$ and $\overline{BL_R}$) and left bit line pairs ($BL_L$ and $\overline{BL_L}$) extending in the vertical direction between the arrangement of memory cells and a plurality of right word lines ($WL_R$) and left word lines ($WL_L$) extending in the horizontal direction are provided and the gates are connected to the left bit line pair ($BL_L$ and $\overline{BL_L}$) so that the upper end part of the figure becomes the left port. In the same way, the gates are connected to the right bit line pair ($BL_R$ and $\overline{BL_R}$) so that the lower end part of the figure becomes the right port. The data bus line is independent for right and left. In the upper end part, namely in the left port side, the left data bus line pair (DB$_L$ and $\overline{DB_L}$) are connected to the left bit line pair (BL$_L$ and $\overline{BL_L}$). In the lower end part, namely in the right port side, the right data bus line pair (DB$_R$ and $\overline{DB_R}$) are connected to the right bit line pair (BL$_R$ and $\overline{BL_R}$). FIG. 4 illustrates details of the peripheral circuits of the one memory cell. As shown in FIG. 4, a conventional multiport memory generally provides each memory cell provides a flip-flop structure such as a conventional SRAM. In FIG. 4, the numerals 13, 14 denote n-channel MOS transistors of which drains and gates are cross-coupled; and 15, 16 indicate load resistances of n-channel MOS transistors 13, 14. A memory cell 17 consisting of a flip-flop is formed by these n-channel MOS transistors 13,14 and load resistances 15, 16. WL$_L$ denotes a word line of the left port; 18, 19, transfer gate transistors (n-channel MOS) of the left port; BL$_L$, $\overline{BL_L}$, bit lines of the left port; WL$_R$, a word line of the right port; 20, 21, transfer gate transistors (n-channel MOS) of the right port; and BL$_R$, $\overline{BL_R}$, bit lines of the right port. According to such a memory cell 17, access from the left port can be realized by activating the word line WL$_L$ and access from the right port can also be realized by activating the word line WL$_R$.

In the dual-port memory shown in FIG. 2 providing such a memory cell 17, when the addresses A$_{0L}$ to A$_{nL}$ are inputted to the left address buffer 3 from the left port, a part of addresses (row address) is transferred to the left row decoder 5 and the remainder (column address) is transferred to the left column decoders 6a, 6b. As a result, the left row decoder 5 selects the row designated by the row address and the left column decoders 6a, 6b selects the column designated by the column address. Thereby, the memory cells designated by the addresses A$_{0L}$ to A$_{nL}$ are selected. The memory cells thus selected are electrically connected to the left I/O circuits 7a, 7b, enabling the read and write operations. Here, the left I/O buffer 4 is controlled by the chip select signal $\overline{CS_L}$ and write enable signal $\overline{WE_L}$ to enable the read and write operations to or from the memory cells through the left I/O circuits 7a, 7b. For the right port, the read and write operations are carried out to the memory cells in the same way.

FIG. 3 shows a plurality of rows and columns forming a memory cell array 17 of memory cells as shown in FIG. 4. In FIG. 3, the numerals 27, 28 denote load transistors (n-channel MOS) for sustaining levels of the bit lines BL$_L$, $\overline{BL_L}$ of the left port; 29, 30, column selecting transistors (n-channel MOS); Y$_L$, a column selecting signal for controlling the column selecting transistors 29, 30 to ON and OFF states; DB$_L$, $\overline{DB_L}$, data bus lines; and 31, 32, load transistors for sustaining levels of the data bus lines DB$_L$, $\overline{DB_L}$. Illustration of a sense amplifier connected to the data bus lines DB$_L$, $\overline{DB_L}$ is omitted here.

Moreover, the numerals 33, 34 denote load transistors (n-channel MOS) for sustaining levels of the bit lines BL$_R$, $\overline{BL_R}$ of the right port; 35, 36, column selecting transistors (n-channel MOS); Y$_R$, a column selecting signal for controlling these column selecting transistors 35, 36 to ON and OFF states; DB$_R$, DB$_R$, data bus lines; 37, 38, load transistors (n-channel MOS) for sustaining levels of the data bus lines DB$_R$, $\overline{DB_R}$; 39, a write circuit; 40 to 43, n-channel MOS transistors; and IN$_R$, $\overline{IN_R}$, write input terminals. Illustration of a sense amplifier connected to the data bus lines DB$_R$, $\overline{DB_R}$ is omitted here.

Here, we will consider a write of data to the memory cell 17 from the right port. In this case, it is assumed that the left port does not select the rows to which the writing is not conducted from the right port. Namely, it is assumed that an H level signal is applied to an word line WL$_{R0}$ and the L level signal to the word line WL$_{L0}$. When an H data is to be written to the memory cell 17, the H level and L level are respectively applied to the write data IN$_R$, $\overline{IN_R}$. In this case, the n-channel MOS transistors 41, 42 of the write circuit 39 turn ON and the n-channel MOS transistors 40, 43 turn OFF, thereby outputting the H level to the data bus line DB$_R$ and the L level to the data bus line $\overline{DB_R}$. The levels of these data bus lines DB$_R$, $\overline{DB_R}$ are transferred to the bit lines BL$_R$, $\overline{BL_R}$ through the column selecting transistors 35, 36, setting the bit line BL$_R$ to the H level and bit line $\overline{BL_R}$ to the L level. As a result, a node 44 of the memory cell 17 turns to the H level and a node 45 to the L level. Thereby, H data can be written into the memory cell 17.

In this case, the level of bit line $\overline{BL_R}$ to be set to the L level is floated away from the ground level by a load current caused by the load transistor 34 of the bit line $\overline{BL_R}$ and a load current caused by the load transistor 38 of the data bus line $\overline{DB_R}$, but because a mutual conductance gm of the load transistors 34, 38 is set smaller than that of the transistor 42 of the write circuit 39, a degree or amount of floating of the level is very small (usually, about hundreds mV). As a result, at the time of data writing mode, this level is transferred to the node 45 of memory cell 17 through the transfer gate transistor 21. This level is enough for turning OFF the n-channel MOS transistor 13 which is cross-coupled with the n-channel MOS transistor 14 and in this case a stable writing operation can be ensured.

However, if access is made from both right and left ports to the different memories even in the same row, there is a risk of erroneous writing. Such access will then be explained hereunder.

We will now discuss when data is written from the right port to the cell 17 located in the left most column in the figure, and the left port is accessing to the same row which is accessed by the right port. In said situation, in other words, the right word line (WL$_{R0}$) and the left word line (WL$_{L0}$) turn the same H level. Then the terminals (IN$_R$) of the writing circuit 39 illustrated at the lower end of the figure is H level and the terminals ($\overline{IN_R}$) is L level so that high data will be written in the cell 17. In order to select the left most column, the Y$_{R0}$ is set to the H level in order to turn ON the column selecting transistor. On the other hand, the right word line (WL$_{L0}$) of the upper most stage turns H level, causing the right bit line pair (BL$_R$ and $\overline{BL_R}$) the cell to become conductive.

In the following description, attention is paid only to the bit line BL$_R$ among the right bit line pair (BL$_R$ and $\overline{BL_R}$). When the input terminal IN$_R$ of gate becomes the H level, the right bit line ($\overline{BL_R}$) becomes the L level and therefore the L level is naturally transferred to the node 45 of the cell. However, it should be noted that both data bus line and bit line connect load transistor in order to maintain the levels. Since more load transistors are connected on the side of gate and cell than the column selecting transistor, when the column selecting transistor turns ON, the bit line ($\overline{BL_R}$) must perfectly drop to the L level However the V$_{CC}$ level is transferred through the load transistor and the level of bit line ($\overline{BLR}$) is floated.

It is also assumed that read operation is to be executed simultaneously through the left port from the cell B existing in the same row as the cell to which data is to be written. In this case, the left word line (WL$_L$) of the row in which the cell B exists must be turned ON. However since the left word line (WL$_L$) is also connected with the cell A to which data is to be written from the right port, the left bit line pair (BL$_L$ and $\overline{BL_L}$) of the column in which the cell A exists is connected to the cell A. Since the left bit line pair (BL$_L$ and BL$_L$) is also connected with a load transistor, a problem of the floating level explained above is accelerated or enchanced.

In this case, the left word line WL$_{L0}$ is set to the H level. For this reason, a current flows into the node 45 of the memory cell 17 through the transfer gate transistor 19 of the left port of memory cell 17 from the load transistor 28 of the bit line $\overline{BL_L}$ of the left port. In addition, in case not only the same row but also the same column are selected by the right and left ports, since the column selecting transistor 30 of the left port turns ON, a current from the load transistor 32 of the data bus line $\overline{DB_L}$ of the left port also flows into the node 45 of memory cell 17.

A current from the left port flowing into the node 45 is absorbed by the write transistor 42 of the right port through the transfer gate transistor 21 of the right port of memory cell 17 and the column selecting transistor 36 of the right port. As explained above, when both right and left ports have selected the same row, the write transistor 42 must absorb a large volume of load current and therefore the level of the bit line $\overline{BL_R}$ to be set to the L level rises.

When both bit lines are conductive for the cells, since the transistor connecting the left bit line and cell and the transistor connecting the right bit line and cell have the equal channel length and channel width by design, namely designed to the equal gm, have levels of both right and left bit lines are divided by resistances through a couple of transistors 19, 21. That is, the level of node 45 of the memory cell 17 becomes equal to the level obtained by dividing, with a gm ratio of the transfer gate transistor 19 and the transfer gate transistor 21, the level of the bit line $\overline{BL_L}$ (power supply voltage V$_{CC}$ - threshold voltage V$_{th}$ of the load transistor) and the level (about hundreds mV) of the bit line $\overline{BL_R}$.

Here, since transfer gate transistors are usually designed in the equal channel length and channel width, the floating of level is further enhanced accelerated and the level of node 45 becomes as high as about 1.5 to 2.5 [V]. At this level, the the n-channel MOS transistor 13 cross-coupled with the n-channel MOS transistor 14 cannot be turned OFF and thereby the write operation becomes unstable and the L data is written in place of the H data.

This problem is not limited only to the dual-port memory (2-port memory) and is also generated in an ordinary multiport memory, wherein a plurality of ports are provided, the bit lines and word lines are provided for respective ports but respective bit lines and word lines are connected to cells through the selecting transistors.

Four-Port Memory

An example of a four-port memory will be explained. FIG. 5 is schematic diagram illustrating the one row of memory cell array and its peripheral circuits of the 4-port memory. In FIG. 5, four word lines from the 1st word line (WL1) to the 4th word line (WL4) extend in correspondence to the four ports in the horizontal direction of the figure. Meanwhile, in the vertical direction, four pairs of bit lines with the 1st bit line pair (BL1, $\overline{BL1}$) to the 4th bit line pair (BL4, $\overline{BL4}$) extend in correspondence to four ports. In the region surrounded by the bit line pair and word line, static memory cells are provided. Moreover, in the areas near the upper and lower end portions, four lines of data bus pair (DB1, $\overline{DB1}$, . . . , DB4, $\overline{DB4}$) also extends in the horizontal direction in correspondence to each port.

At the end portion of each bit line extending in the vertical direction, a column selecting transistor is provided. When this column is selected for a read or write operation, this column selecting transistor turns ON, connecting the data bus line and bit line which are usually separated in general.

Here, it is assumed that the H level is to be written from the 3rd port by selecting a static memory cell (J in FIG. 5) included in the 2nd row of the 4-port memory. In this case, the H level is applied to IN3 of the input terminals (IN3, $\overline{IN3}$) of the 3rd gate, while the L level to $\overline{IN3}$. Therefore, the transistors Tr1, Tr4 among Tr1 to Tr4 turn OFF, while Tr2 and Tr3 turn ON. The bit line BL3 rises to the H level and the bit line $\overline{BL3}$ drops to the L level. The column selecting signal Y3 becomes the H level, causing two column selecting transistors provided for the 3rd bit line pair to turn ON. When the 3rd word line WL3 becomes the H level, the transistor turns ON, electrically connecting the 3rd bit line pair (BL3, $\overline{BL3}$) and the static memory cell J.

In this case, it is also assumed that another static memory cell from which the reading operation is to be executed through the 1st port exists in the same row of the static memory cell J (right side extended from J not illustrated) and the other static memory cell from which the reading operation is to be executed through the 2nd port exists also in the same row of the same static memory cell. Since the 1st and 2nd word lines turn ON in the 2nd row, these two transistors connected to these word lines through the gates also turn ON. Thereby, the static memory cells are connected naturally to the 1st bit line pair, 2nd bit line pair and 3rd bit line pair, a current flows toward the input terminal $\overline{IN}$ through a load transistor connected to respective bit line pairs and the level of the 3rd bit line pair ($\overline{BL3}$) which should naturally be in the L level is floated to a higher value.

Selection of the same row from a plurality of ports is possible and the probability of this selection increases as the number of ports increases. Moreover, this problem has been considered more seriously with enlargement of the dual-port memory scale. As the scale of the dual-port memory enlarges but the chip size must be small comparatively, then transfer transistors, which are connected between a memory cell and a bit line, need to be compact size. But if the transfer transistors are to small in size, then the characteristics of each transfer transistor of the plural ports vary in the transfer process.

SUMMARY OF THE INVENTION

It is therefore an object of the present invention to further the reliability of a writing operation of a multiport memory by eliminating a problem of an erroneous writing operation writing to cells during selection of the same row from a plurality of ports in common in the multiport memory as explained above. A structure operation of a multiport memory of the present invention will be summarized as follow: level floating of bit lines can be prevented by short-circuiting the bit lines corresponding to the ports used for data writing and reading operation only when writing is to be executed, from the other port, to the other memory cell arranged in the same row as the memory cell during read operation from a certain port.

In detail, a multiport memory of the present invention provides a structure wherein a plurality of ports for reading and writing operations are for one memory cell, comprising a row address matching detection circuit which detects that a plurality of memory cells included in the same column are selected for a read or write operation and a switch for substantially short-circuiting the bit lines corresponding to the ports used for the read or write operation, whereby this switch is turned ON when the row address matching detection circuit detects such selection.

In more detail, a multiport memory of the present invention is provided with a structure comprising:

a plurality of ports provided in the static memory cell for the read and write operations;

a plurality of bit lines and word lines provided corresponding to the plurality of ports;

a switch for electrically connecting, depending on level of the word lines, the bit lines corresponding to the word lines and bit lines to the static memory cell; and a short-circuit device for substantially short-circuiting the bits lines corresponding to the ports selected for write operation among the bits lines corresponding to a plurality of selected ports and the other optional bit lines, when the plurality of word lines included in the same row are selected from the plurality of ports for the read or write operation.

BRIEF DESCRIPTION OF THE DRAWINGS

FIG. 1 is a block diagram indicating an application example of a dual-port memory;

FIG. 2 is a structural block diagram of a conventional dual-port memory;

DESCRIPTION OF THE PREFERRED EMBODIMENTS

Figure 3A:
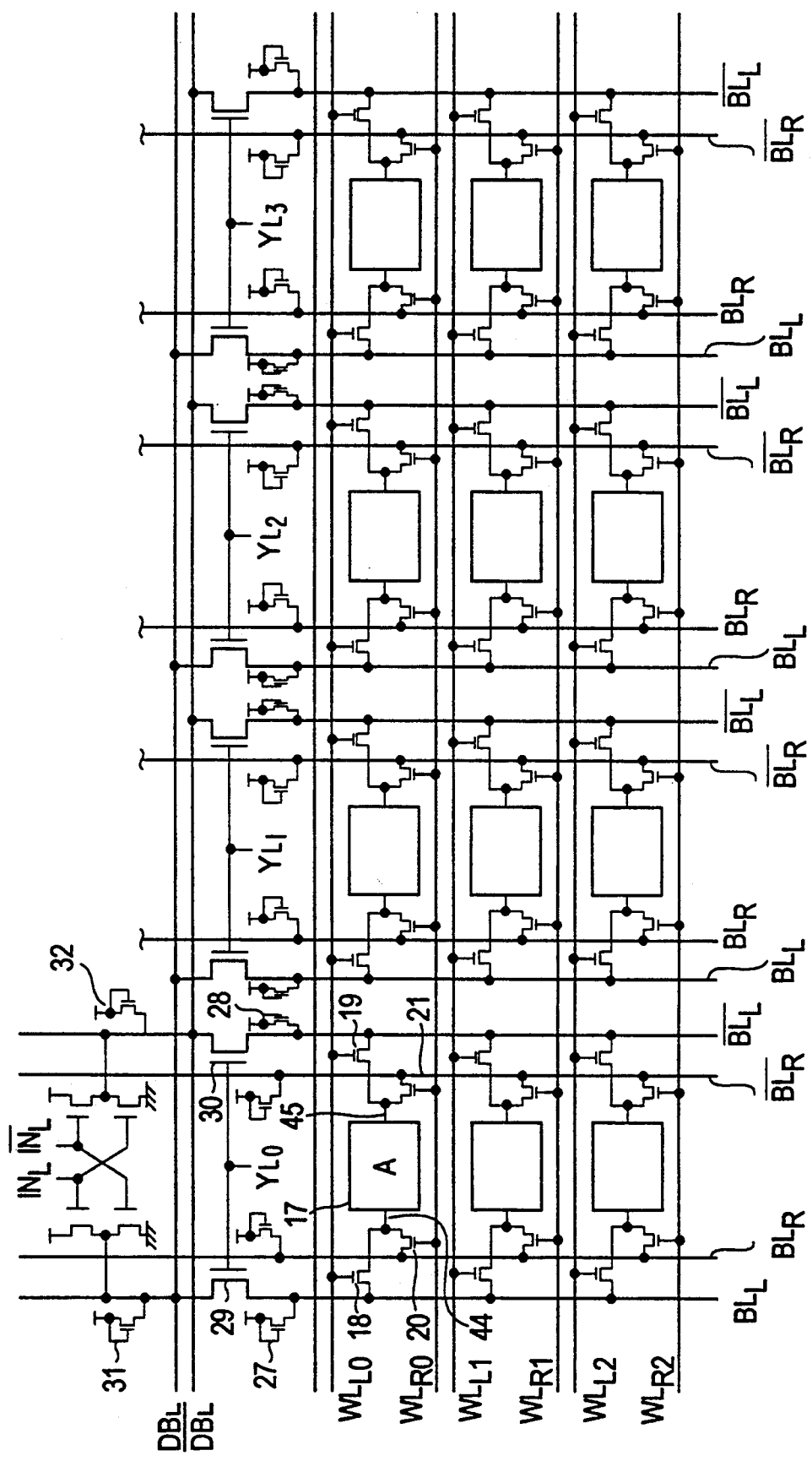
FIG. 3, including 3(a) and 3(b), is a partial schematic diagram of the peripheral circuits of a memory cell array of the conventional dual-port memory.

A preferred embodiment of the present invention will be explained hereunder in detail.

A dual-port memory having a couple of ports will be explained first and a 4-port memory will then be explained as a complementary explanation.

Dual-port Memory

An embodiment of the present invention will be explained with reference to FIG. 6 to FIG. 9. The like elements in the drawings already explained are given the like reference numerals and the explanation will never be repeated.

Figure 6:
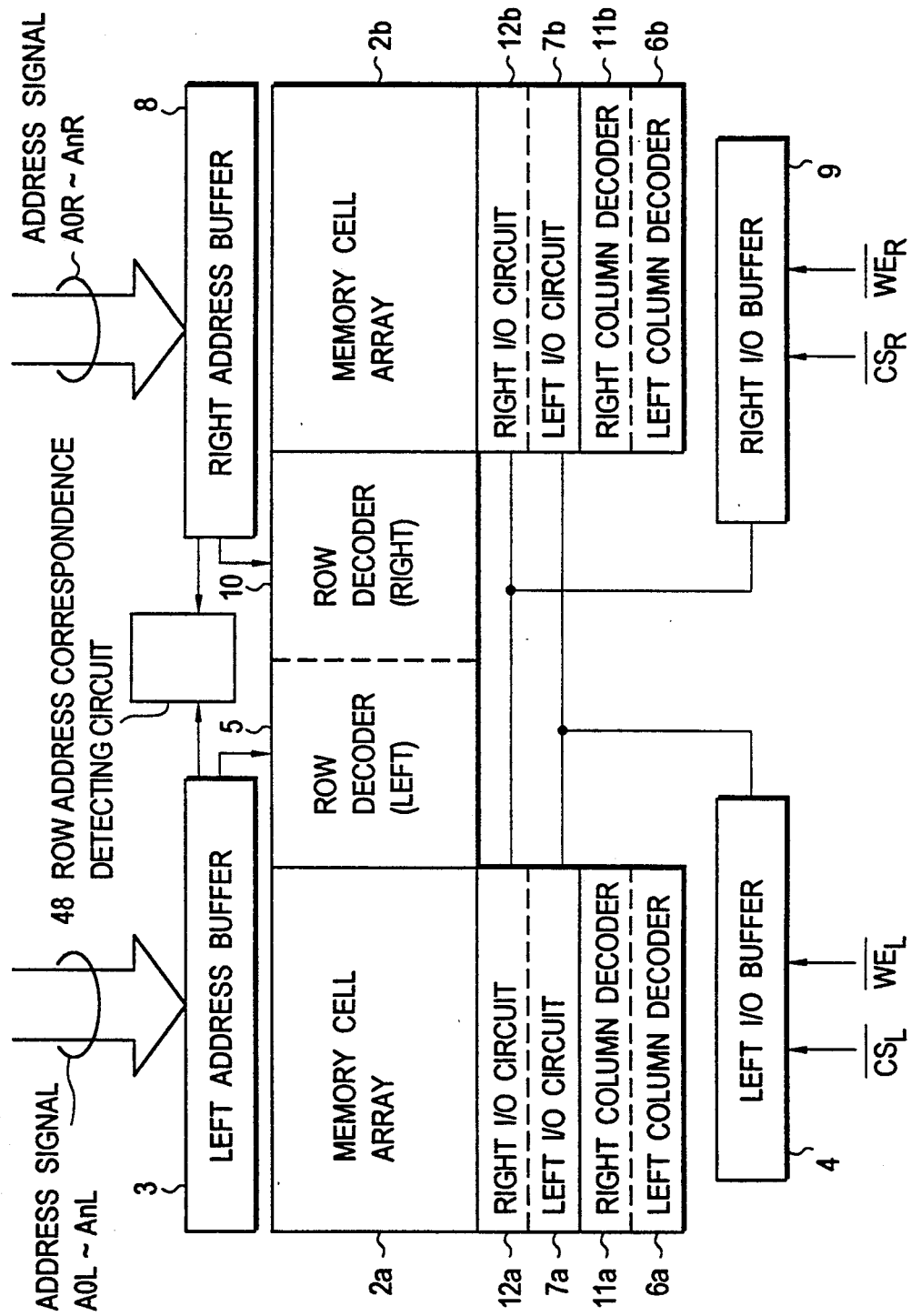
FIG. 6 is a structural block diagram of a dual-port memory of the present invention.

FIG. 6 is a structural block diagram of a dual-port memory of the present invention. Referring to this figure, where is no particular technical difference from the conventional dual-port memory like elements are given the like reference numerals. Only difference from the conventional one is that the outputs of address buffers are input to a row address matching detection circuit. Moreover, although not illustrated in the figure, a structure newly added is that an output of this row address matching detection circuit is input to the gate of a short-circuit transistor provided at the end portion of the bit line columns of the memory cell array.

The row address matching detection circuit has a structure that right address signals ($A_{OR}$ to $A_{iR}$) inputted corresponding to the right port and left address signals ($A_{OL}$ to $A_{iL}$) input corresponding to the left port are input and matching of these address signals is detected.

Figure 3B:
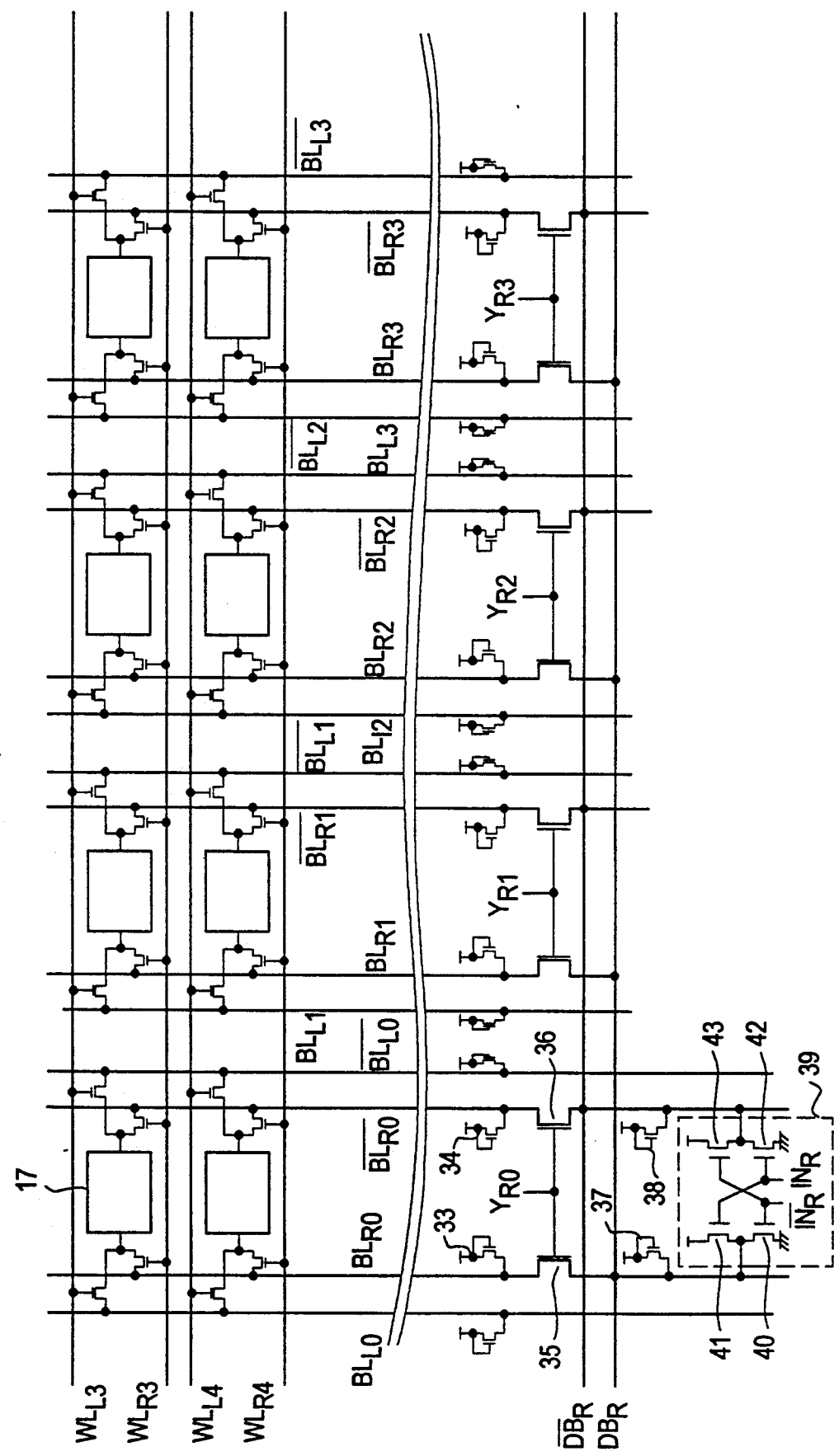
Figure 7B:
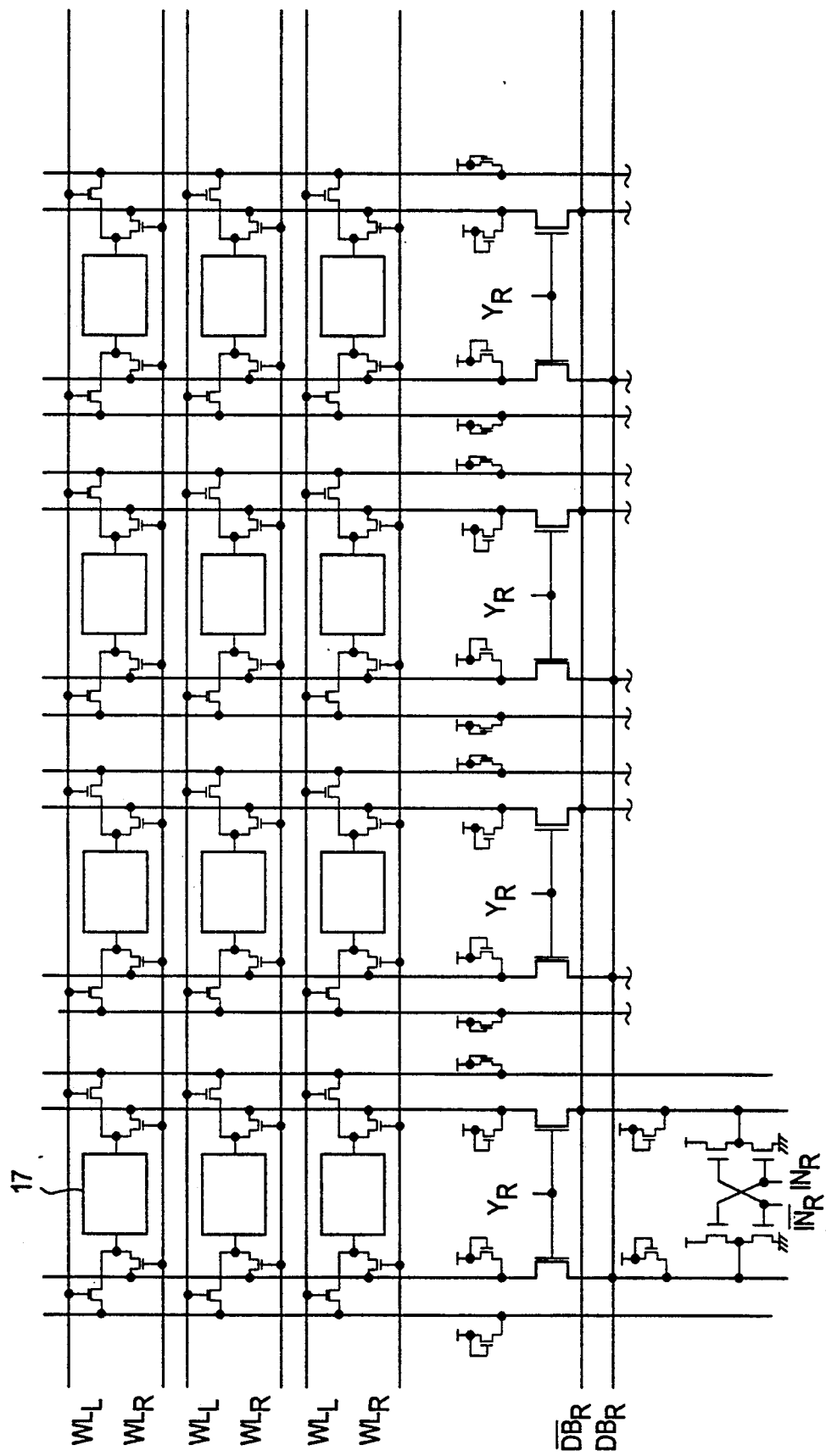
FIG. 7, including 7(a) and 7(b), is a partial schematic diagram of the peripheral circuits of a memory cell array of the dual-port memory of the present invention.

In this embodiment, a part of the memory cell array is formed as shown in FIG. 7. A difference from the prior art shown in FIG. 3 is that the short-circuit transistors (n-channel MOS) 46, 47 are provided at the upper side for mutually short-circuiting the right and left bit lines of each column. Here, the bit line short-circuit transistor 46 is connected to the bit line $BL_L$ of the left port through the drain and is also connected to the bit line $BL_R$ of the right port through the source. In addition, the bit short-circuit transistor 47 is connected to the bit line $\overline{BL_L}$ of the left port through the drain and is also connected to the bit line $\overline{BL_R}$ of the right port through the source. An output of the row address matching detection circuit 48 shown in FIG. 6 (row address matching detection signal AM) is connected to the gates of these short-circuit transistors 46, 47. When the row addresses input from the right and left ports are determined to match as a result of the comparison, an output is set to the H level, causing the gate to turn ON and thereby the right and left bit lines are mutually short-circuited for each column.

Figure 4:
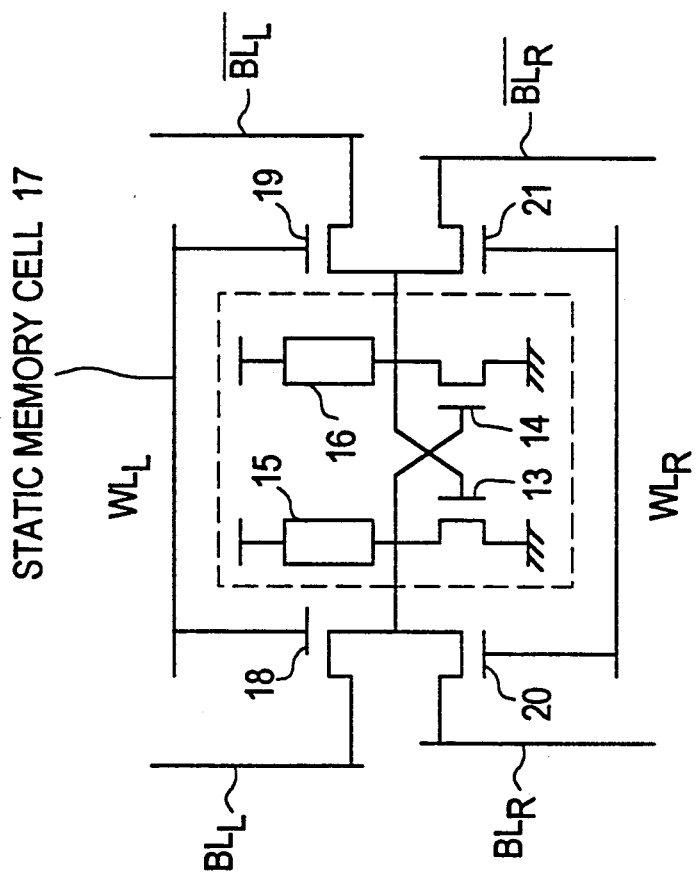
FIG. 4 is a partial schematic diagram of the one memory cell of the conventional dual-port memory.

Moreover, in the row address matching detection circuit 48, the left row address signals ($A_{OL}$ to $A_{iL}$) output from the left row address buffer 3 shown in FIG. 6 and the right row address signals ($A_{OR}$ to $A_{iR}$) output from the right row address buffer 8 are divided for each bit and the input to exclusive OR circuits ($52_0$ to $52_i$). The exclusive OR circuits $52_0$ to $52_i$ provided for each row address bit output the L level when row address bits match or the H level when the row address bits do not match. Outputs of the exclusive OR circuits ($52_0$ to $52_i$) are inputted at a time to a NOR circuit 53 and its output is input to the gates of short-circuit transistors 46, 47 to control it for ON and OFF states. When outputs of the exclusive OR circuits $52_0$ to $52_i$ match in the all address bits, the NOR circuit 53 outputs the H level as the row address matching detection signal AM and outputs the L level as the signal AM when such output do not match. The other structure is the same as that of the conventional dual-port memory of the FIG. 4.

Figure 8:
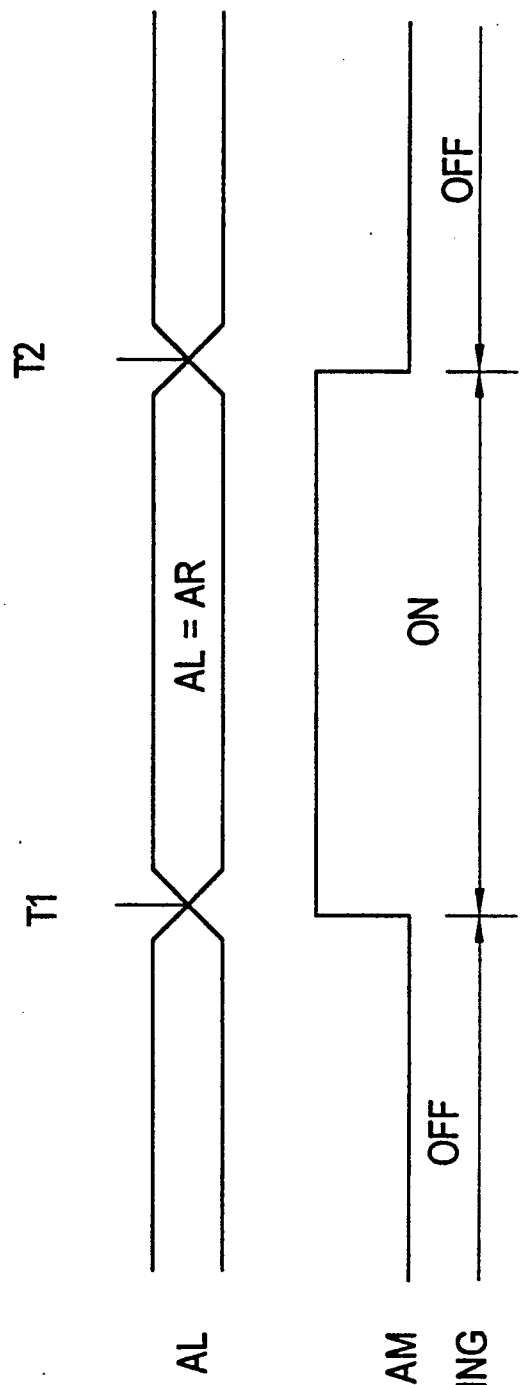
FIG. 8 is a diagram for explaining operations of the dual-port memory of the present invention.

FIG. 8 is a timechart for explaining operations of an embodiment of the present invention. At the time T1, the left row address $A_L$ changes and this left row address $A_L$ matches with the right row address $A_R$. At the time T2, the left row address $A_L$ changes and this left row address $A_L$ does not match with the right row address $A_R$.

First, since the left row address $A_L$ and right row address $A_R$ do not match until the time T1, the row address matching detection signal AM is in the L level. As a result, the bit line short-circuit transistors 46, 47 turn OFF and the bit lines $BL_L$, $\overline{BL_L}$ and $BL_R$, $\overline{BL_R}$ of both right and left ports execute the separate operation of each port and there is no mutual interference of signals.

However, when the left row address $A_L$ and right row address $A_R$ match at the time T2, the address matching detection signal AM becomes the H level. As a result, the bit line transistors 46, 47 turn ON and the bit lines $BL_L$ and $BL_R$, $\overline{BL_L}$ and $\overline{BL_R}$ are respectively short-circuited.

Thereafter, the left row address $A_L$ and right row address $A_R$ do not match at the time T2. Thereby, the row address matching detection signal AM becomes the L level and the bit line short-circuit transistors 46, 47 turn OFF.

Here, discussed is the case where the H data, for example, is written to the memory cell from, for example, the right port, in case both row selection line $WL_L$ of the left port and row selection line $WL_R$ of the right port are set to the H level as in the case of FIG. 3.

In this case, a current from the load transistor 28 of the bit line $\overline{BL_L}$ of the left port flows, in the present embodiment, to the bit line $\overline{BL_R}$ of the right port passing through the bit line short-circuit transistor 47 and moreover it is absorbed by the write transistor 42 through the column selecting transistor 36 of the right port. Here, when the mutual conductance gm of the bit line short-circuit transistor 47 is set to a high value, the L level of the bit line $\overline{BL_L}$ can be lowered to the level which is almost equal to the L level of the bit line $\overline{BL_R}$. Here, the L level of node 45 of the memory cell 17 becomes sufficiently low level which is equal to the L level of the bit lines $\overline{BL_L}$, $\overline{BL_R}$. Therefore, the MOS transistor 13 in the memory cell 17 shown in FIG. 4 (reference is also made to FIG. 4, which is used for explaining the related arts, because the memory cell 17 itself does not differ from the conventional one) can be turned OFF and a stable write operation can be achieved.

In case the read operations are carried out from both right and left ports, the bit line short-circuit transistors 46, 47 do not result in any interference, because the bit lines of both ports of each column realize or perform the same operation.

Moreover, it is difficult for the transfer gate transistors 18 to 21 of the memory cell 17 to set a wide channel width due to a constraint on chip area. But, according to the present invention, it is possible to provide a wider channel width W, because only one pair of bit line short-circuit transistors 46, 47 is arranged in each column. Therefore, it becomes possible in the present invention to set the mutual conductance gm to a higher value.

Four-port Memory

Figure 5A:
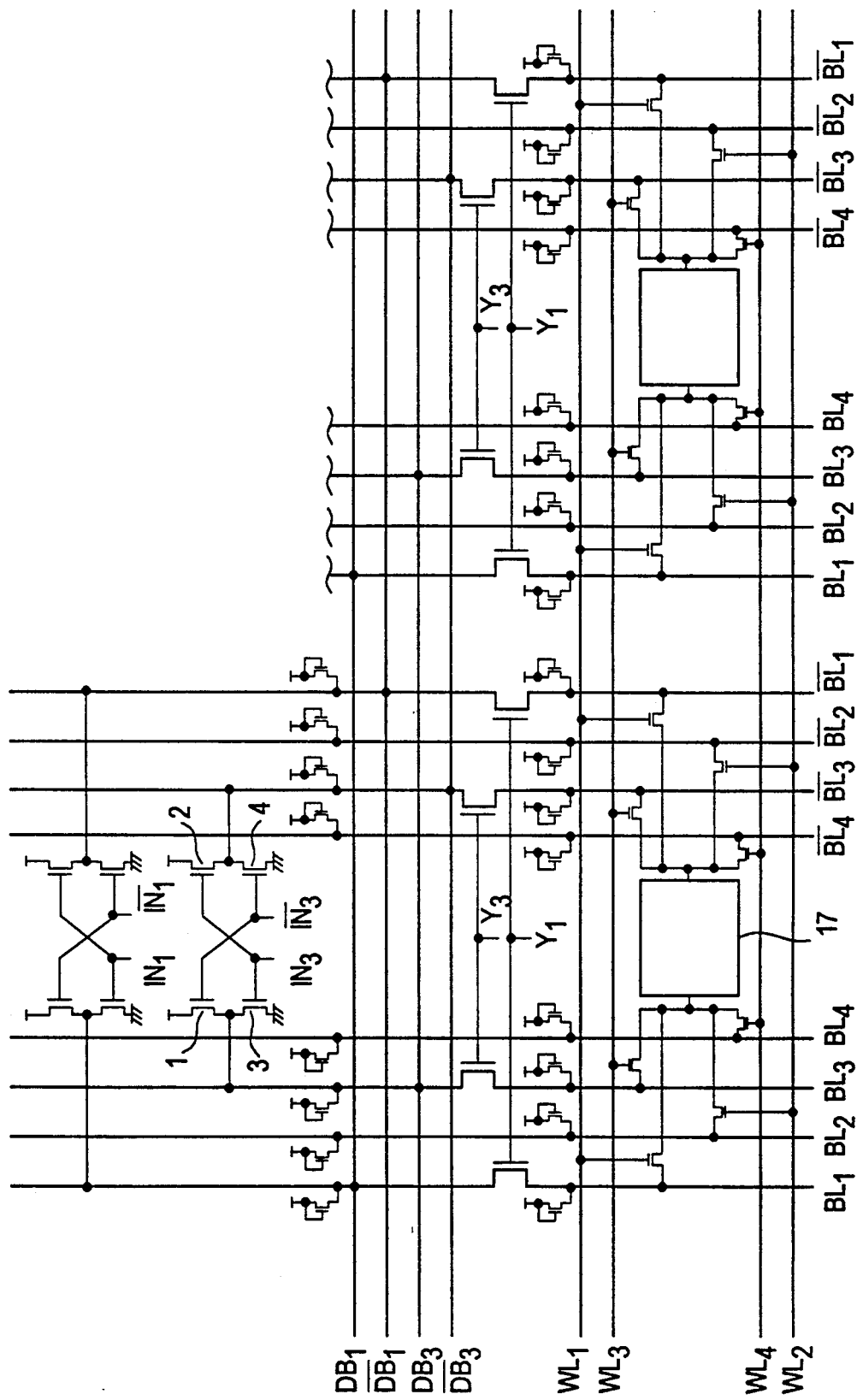
FIG. 5, including 5(a) and 5(b), is a partial schematic diagram of the peripheral circuits of memory cells of the conventional 4-port memory.
Figure 5B:
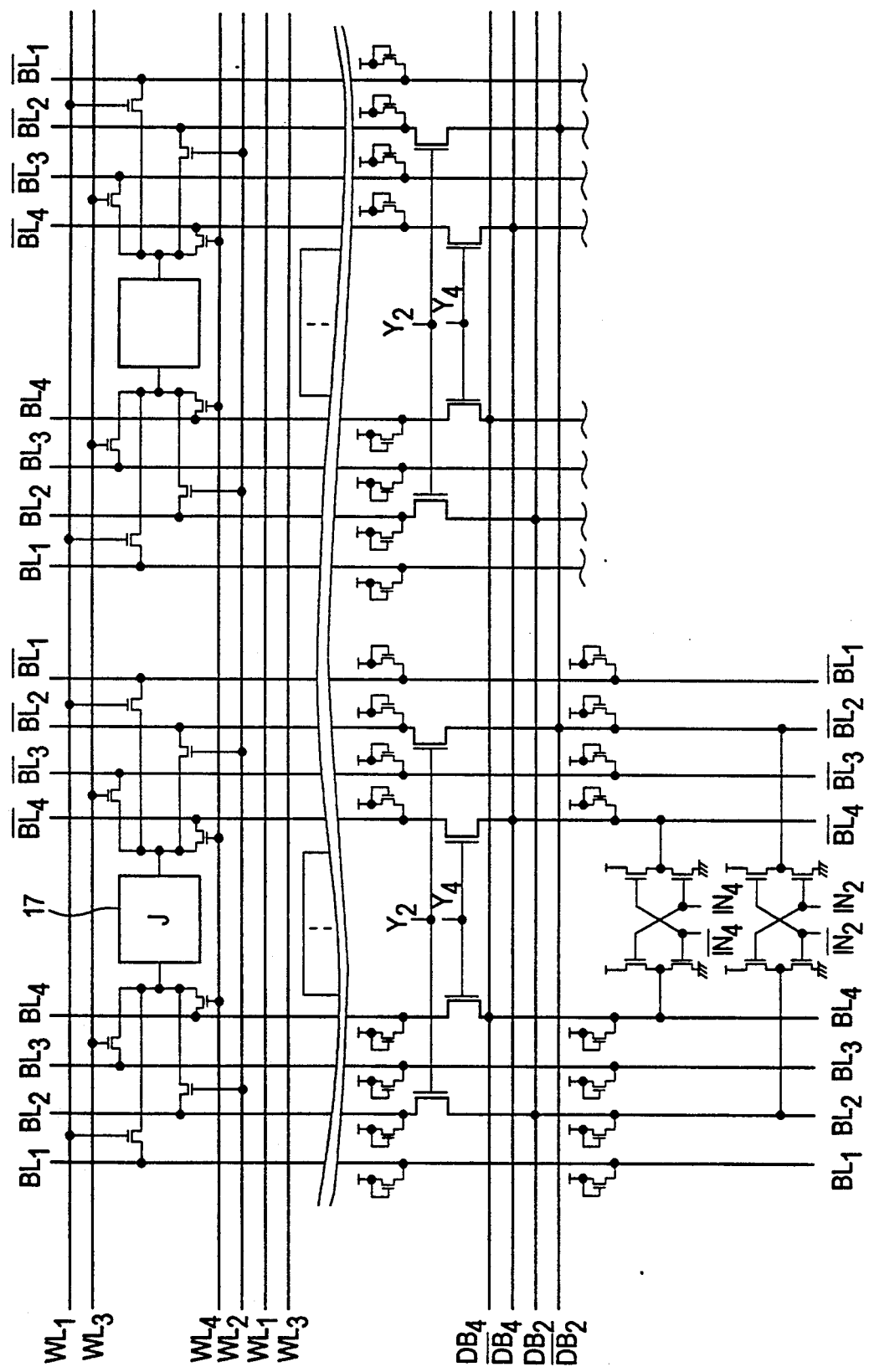
Figure 9A:
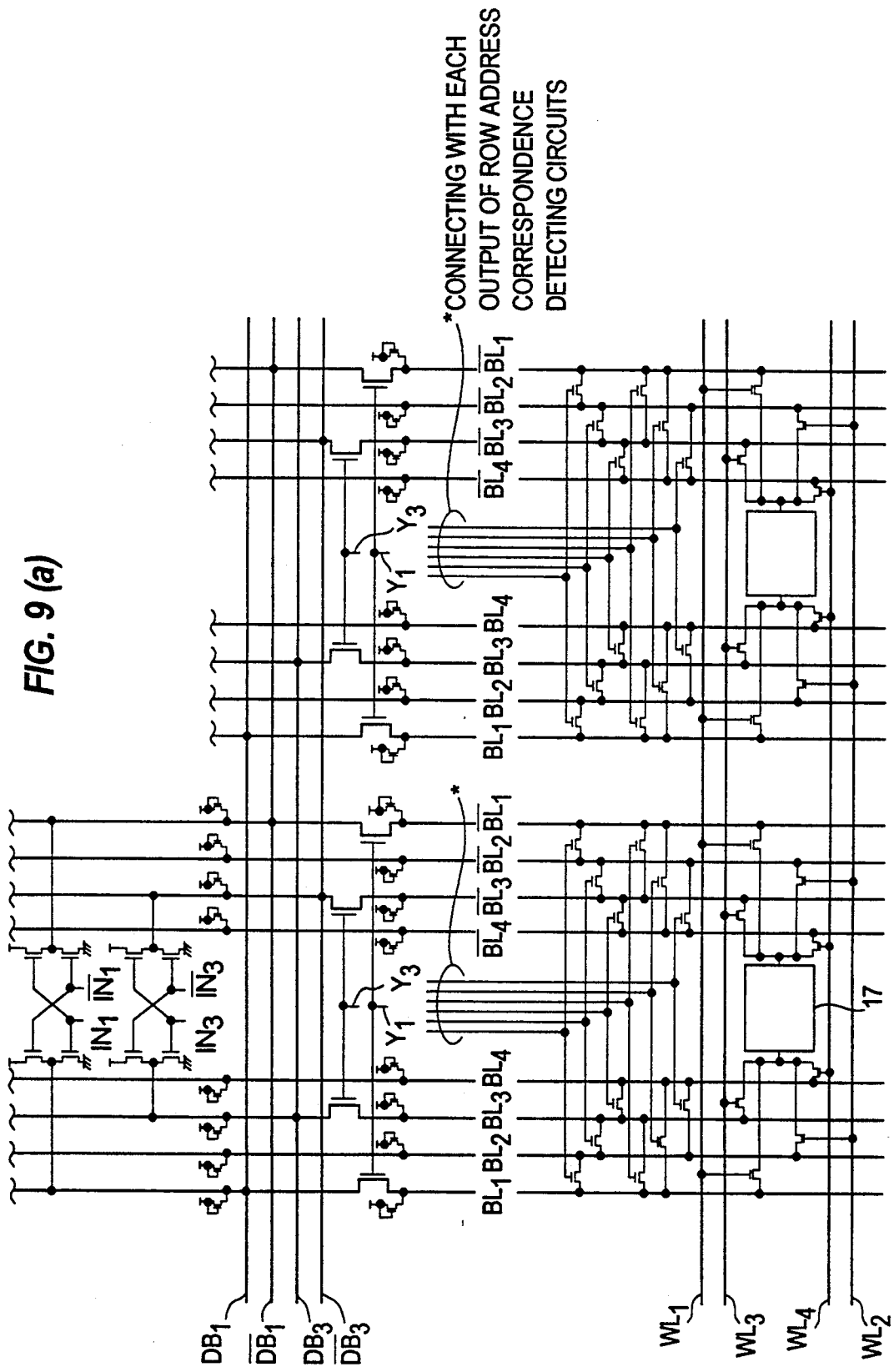
FIG. 9, including 9(a) and 9(b), is a partial schematic diagram of the peripheral circuits of a memory cell array of a 4-port memory of the present invention.
Figure 9B:
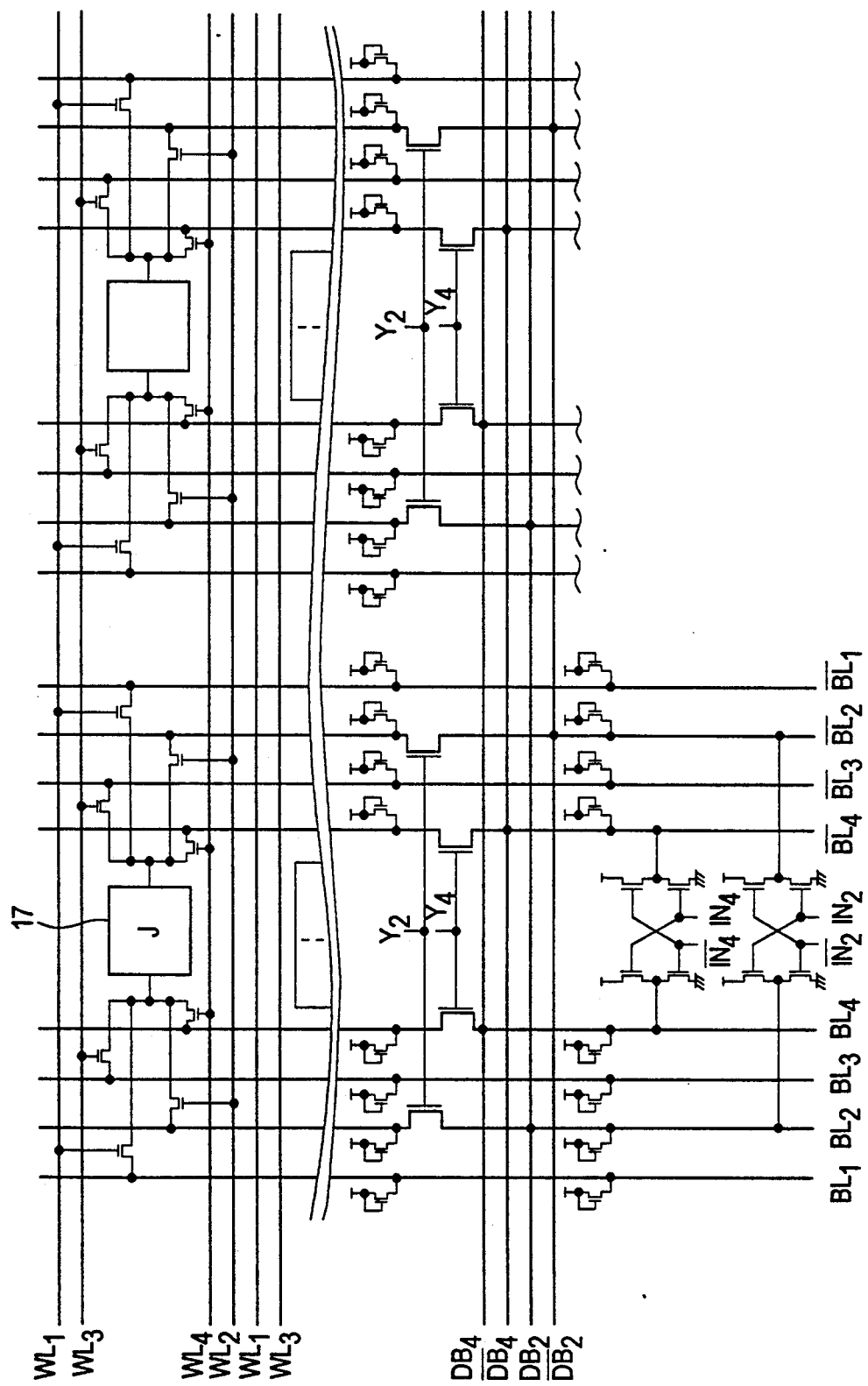

Next, an example of a 4-port memory will be explained. FIG. 9 is a partial schematic diagram of one column of a memory cell array of the 4-port memory and the peripheral circuits thereof. In comparison with FIG. 5 which shows the corresponding related arts, FIG. 9 newly adds the structure that desired two bit lines among ($BL_1$, $BL_2$, $BL_3$, $BL_4$) of the bit line pairs ($BL_1$, $\overline{BL_1}$), ($BL_2$, $\overline{BL_2}$), ($BL_3$, $\overline{BL_3}$), ($BL_4$, $\overline{BL_4}$) are mutually short-circuited and simultaneously a short-circuit transistor which mutually short-circuits the corresponding two lines of ($\overline{BL_1}$, $\overline{BL_2}$, $\overline{BL_3}$, $\overline{BL_4}$) is provided. The gate of the short-circuit transistor provided in the side of bit lines ($BL_1$, $BL_2$, $BL_3$, $BL_4$) (upper section of FIG. 9) is connected with the gate of the short-circuit transistor provided in the side of bit lines ($BL_1$, $BL_2$, $BL_3$, $BL_4$) and an output of the row address matching detection circuit is connected to this gate.

Figure 10:
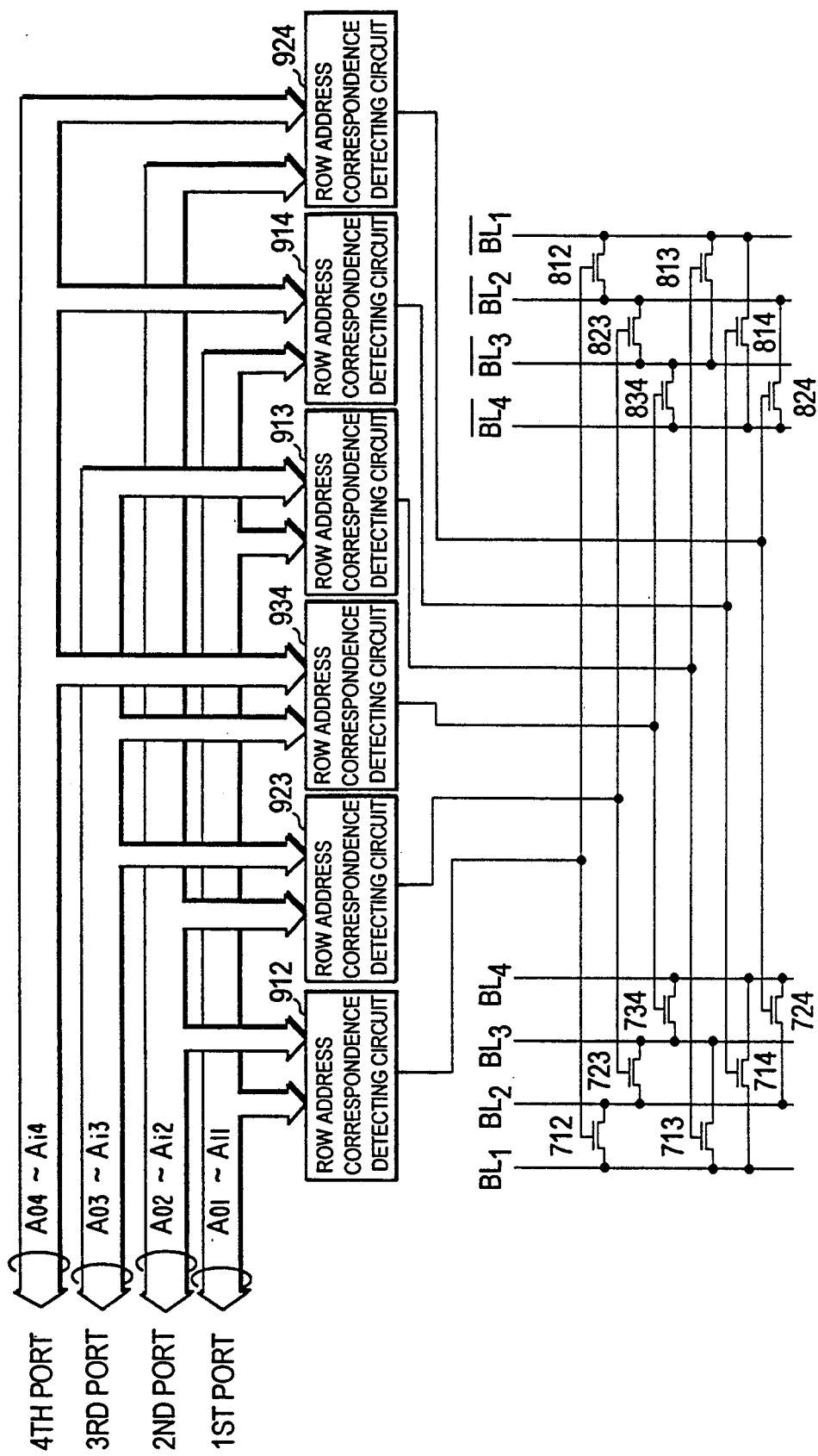
FIG. 10 is a wiring diagram of respective ports and short-circuit transistors of the 4-port memory of the present invention.

With reference to FIG. 10, the relationship between the row address matching detection circuit 48 and the short-circuit transistor will then be explained. FIG. 10 shows only one column by enlarging the bit line pair located at the upper part of the FIG. 9. The short-circuit transistors (712, 723, 734, 713, 714, 724) are provided between bit lines (BL1 to BL4). In addition, the short-circuit transistors (812, 823, 834, 813, 814, 824) are also provided between the bit lines ($\overline{BL_1}$ to $\overline{BL_4}$). A gate of each short-circuit transistor is connected to the row address matching detection circuit for example the gates of short-circuit transistors (712, 812) are connected with an output of the row address matching detection circuit (912). To this row address matching detection circuit (912), the address signals ($A_{01}, \ldots, A_{il}$) corresponding to the 1st port and address signals ($A_{02}, \ldots, A_{i2}$) corresponding to the 2nd port are input, and matching and mismatching are decided. Namely, when access from the 1st port and 2nd port eventually decodes to the same row, this row address matching detection circuit 912 outputs the H level, the bit lines (BL1 and BL2) and the bit lines ($\overline{BL1}$ and $\overline{BL2}$) are respectively short-circuited, inhibiting erroneous write operation in the of the dual-port memory explained previously. The other bits are also short-circuited and when a plurality of bit lines are accessed, the object bit lines are all short-circuited.

In FIG. 9, four word lines from the 1st word line (WL1) to 4th word line (WL4) corresponding to four ports extend in the horizontal direction. Moreover, in the vertical direction, for pairs of bit line pair from the 1st bit line pair (BL1, $\overline{BL1}$) to the 4th bit line pair (BL4, $\overline{BL4}$) corresponding to four ports extend. In the region surrounded by the bit line pairs and word lines, static memory cells are provided. Moreover, in the region near the upper and lower end portions of the figure, four pairs of data bus line pair (DB1 $\overline{DB1}$, . . . , DB4, $\overline{DB4}$) extend in the horizontal direction corresponding to the four ports.

At the end portion of each bit line extending in the vertical direction, a column selecting transistor is provided. When this column is selected for the read or write operation, this column selecting transistor turns ON and the data bus line and bit line which are usually separated electrically are connected.

An attempt to write the H level from the 3rd port in the 4-port memory, explained above, by selecting a static memory cell (J in FIG. 9) belonging to the 2nd row will be discussed. In this case, the H level is applied to the input terminal IN3 of the input terminals (IN3, $\overline{IN3}$) of the 3rd gate, while the L level is applied to the terminal $\overline{IN3}$. Among the transistors (Tr1 to Tr4), Tr1, Tr4 turn OFF and Tr2, Tr3 turn OFF. The bit line BL3 rises to the H level, while the bit line BL3 drops to the L level. The column selection signal Y3 becomes the H level and a couple of column selection transistors provided for the 3rd bit line pair turn ON simultaneously. When the 3rd word line WL3 becomes the H level, a transistor turns ON and thereby the 3rd bit line pair (BL3, $\overline{BL3}$) and static memory cell J are connected electrically.

It is now assumed that another static memory cell for which the reading operation is to be executed from the 1st port exists within the same row to which the static memory cell J belongs (right extending direction of J not illustrated) and the other static memory cell for which the read operation is to be executed from the 2nd port also exists therein. Namely, it is assumed that read operation is carried out from the 1st and 2nd ports among four ports and a write operation is to be executed from the 3rd port to the different memory cells in the same row.

Thereby, since the 1st and 2nd word lines turn ON in the 2nd row, two transistors connecting the gates to these word lines turn ON simultaneously. Thereby, the static memory cell is naturally connected to the 1st bit line pair, 2nd bit line pair and 3rd bit line pair. However, erroneous writing operation is not generated for the reasons mentioned below.

A row address input from the 3rd port for write operation and a row address input from the 1st and 2nd ports for read operation are input respectively to the row address matching detection circuit and thereby the H level is outputted when these match. The H level signal output is input to the gates of short-circuit transistors, provided between the 3rd bit line and 1st, 2nd bit lines so that these bit lines in the 2nd row to which the static memory cell J for the write operation belongs and thereby these short-circuit transistors turn ON. In the 2nd row to which the static memory cell J belongs, the 1st, 2nd and 3rd bits are mutually connected and the problem of L level floating in the 1st bit line can be solved Therefore, so-called erroneous writing in which the information to be written is inverted can be eliminated.

In summary, it is important for ensuring the effect of the present invention to provide a means which substantially short-circuits the bit lines corresponding to the write port and read port, in case a plurality of ports have selected the static memory cells in the same row. A modification conforming to the structure described above will now be explained. For example, if read operation from the static memory cells in the object rows of the four ports has been carried out from a plurality of ports as explained above, it is no longer necessary to short-circuit the 3rd bit line which participates in the write operation and the 1st and 2nd bit lines which participate in the read operation and the effect of the present invention can be obtained when the 3rd bit line which participates in the write operation and any one of the 1st and 2nd bit lines are connected. However, the write bit line must be short-circuited with two read bit lines for essentially solving the problem of L level floating of the bit lines. In this case, a selection circuit for a read bit line is necessary, when a plurality of bit lines participating in the read operation exist, for selecting only one of such bit line and short-circuiting it with the bit lines participating in the write operation. Therefore, this method cannot be said to be a reasonable method because it unnecessarily complicates the circuit, even if there is no considerable merit.

As a preferred embodiment of a multiport memory of the present invention, a dual-port memory and a 4-port memory have been explained above.

The present invention also allows various modifications. For example, the number of ports are not limited only to 2 or 4 and it is possible for those who have skill in the art to easily realize various modification even when the number of ports are set to an optional number. For a change in the number of ports, a change of the circuit is also necessary to enable as many inputs as the number of ports for the row address matching detection circuit. For instance, the row address matching detection circuits are built in accordance with the number of combinations of all ports. Namely, when the number of ports is set to 4, with respect to the row address matching detection circuit as many as $_4C_2$ ($=6$) are required for the inputs of 1st port and 2nd port, 1st port and 3rd port, 1st port and 4th port, 2nd port and 3rd port, 2nd port and 4th port and 3rd port and 4th port. With respect to the short-circuit transistor connecting the bit lines of each column, as many as $_4C_2(=6)$ are provided, according to the above explanation, between the 1st bit line and 2nd bit line, between 1st bit line and 3rd bit line, between 1st bit line and 4th bit line, between 2nd bit line and 3rd bit line, between 2nd bit line and 4th bit line and between 3rd bit line and 4th bit line and thereby the outputs can be connected to the gates. In general, when n is a freely selected integer number, n-pairs of bit line and n word lines are arranged corresponding to individual static memory cells in the n-port memory and a short-circuit transistor is connected between bit lines in each pair of n-pair bit line pair, namely two pairs of n bit lines. Therefore, total of $_nC_2$ short-circuit transistors are required. Moreover, the outputs of $_nC_2$ row address matching detection circuits are input on a one to one basis to the gates of the $_nC_2$ short-circuit transistors.

In addition, a short-circuit switch to be used for short-circuiting the bit lines is not always required to formed as a MOS transistor. It may be formed by other MIS transistors in which a gate insulating film of this transistor is formed by a film other than an oxide film, for example, nitride film or oxide nitride film. Moreover, if necessary, the MOS transistor may be replaced with a bipolar transistor. Moreover, each port is also not always required to have the structure both a write and read operation. A certain port may have the function to operate only as the read-only port, therefore without having the input gate. But since the effect of the present invention is distinctive for eliminating erroneous write operation, at least one port must be the write port.

According to the present invention, a stable write operation can be ensured even when the same row is selected from a plurality of ports which are making an access and the write operation is carried out from the one port because the levels of the one and the other bit lines of the port in on the opposite side from the port from which the write operation is carried out can be set to the level equal to that for the write operation, due to the structure that provides that, when the same row is selected from a plurality of ports, the one bit line of the bit line pair of the port in the same column and the one bit line of the bit line pair of the other port are short-circuited and the other bit line of the bit line pair of a certain port and the other bit line of the bit line pair of the other port are also short-circuited.

What is claimed is:

1. A multiport memory, comprising:

static memory cells;
ports provided for writing or reading data to or from said static memory cells;
independent bit lines and word lines with levels and corresponding to said ports;
switches adapted to electrically connect said bit lines, corresponding to said word lines of a same port, to said static memory cells depending on the levels of said word lines; and
short-circuit devices adapted to substantially short-circuit between the bit lines of each column of corresponding ports at a time a same row is selected by the corresponding ports.

2. A multiport memory according to claim 1, wherein said short circuit devices comprise switches formed of MIS type transistors.

3. A multiport memory according to claim 2, wherein the switches connected to a same cell are almost a same size.

4. A multiport memory according to claim 1, wherein said short-circuit devices produce substantial short-circuits between the bit lines of each column of corresponding ports.

5. A multiport memory, comprising:
static memory cells;
ports provided for write or read operations to or from said static memory cells;
independent bit lines and word lines with signal levels and corresponding to said ports;
switches adapted to electrically connect said bit lines, corresponding to said word lines of a same port, to said static memory cells depending on the signal levels of said word lines; and
short-circuit devices adapted to substantially short circuit between the bit lines corresponding to the port selected for a write operation among the bit lines corresponding to a plurality of selected ports and other bit lines when word lines belonging to a same row are selected from the plurality of the ports for the write or read operation, said short-circuit devices comprising:
a row address matching detection circuit which compares row addresses input to respective ports with each other and outputs a signal when the row addresses of the ports match; and
a short-circuit switch connected to said detection circuit and the row bit lines and which receives the output signal from said row address matching detection circuit and short-circuits the bit lines of each column of corresponding ports.

6. A multiport memory according to claim 5, wherein said short-circuit switch comprises a MIS type transistor.

7. A multiport memory according to claim 6, wherein the switches connected to a same one of the cells are formed almost of the same size.

8. A multiport memory according to claim 5, wherein said short-circuits devices generate short-circuits between the bit lines corresponding to the ports selected for the write operation among the bit lines corresponding to the plurality of the selected ports and other bit lines.

9. A multiport memory according to claim 5, wherein said short-circuit switch is provided at an end of each bit line located outside of a cell region comprising said static memory cells.

10. A multiport memory according to claim 5, wherein said short-circuit switch comprises a MIS type transistor.

11. A multiport memory according to claim 10, wherein a mutual conductance Gm of the MIS type transistor comprising said short-circuit switch is greater than a mutual conductance Gm of a MIS type transistor forming said switches.

12. A multiport memory, comprising:
static memory cells;
a first port and a second port provided for a write or a read operation to or from said static memory cells;
independent first and second bit lines and independent first and second word lines having levels and provided corresponding to said first and second ports;
switches adapted to electrically connect said bit lines corresponding to said first and second word lines of a same port to said static memory cells depending on the levels of said first and second word lines; and
short-circuit devices adapted to substantially short circuit between the bit lines of each column of said first and second corresponding ports at a time a same row is selected by said first and second ports.

13. A multiport memory according to claim 12, wherein said short-circuit devices comprise a MIS type transistor.

14. A multiport memory according to claim 13, wherein the switches which are connected to a same one of the cells are formed almost of a same size.

15. A multiport memory according to claim 12, wherein said short-circuit devices are provided at an end of each bit line located outside of a cell region comprising said static memory cells.

16. A multiport memory according to claim 12, wherein said short-circuit devices comprise a short circuit switch comprising a MIS type transistor.

17. A multiport memory according to claim 16, wherein a mutual conductance Gm of the MIS type transistor comprising said short-circuit switch is greater than to a mutual conductance Gm of a MIS type transistor forming said switches.

18. A multiport memory, comprising:
static memory cells;
a first port and a second port provided for a write or a read operation to or from said static memory cells;
independent first and second bit lines and independent first and second word lines having levels and provided corresponding to said first and second ports;
switches for electrically connecting said bit lines corresponding to said first and second word lines of a same port to said static memory cells depending on cells of said first and second word lines; and
short-circuit devices for substantially short-circuiting between the bit lines of each column of corresponding ports at a time a same row is selected by a plurality of said ports, said short-circuit devices comprising:
a row address matching detection circuit which compares row addresses input to respective ports with each other and outputs a signal when the row addresses of the plurality of ports match; and a short-circuit switch connected to the detection circuit and to the row bit lines and which receives the signal from said row address matching detection circuit and substantially short circuits the bit lines of each column of corresponding ports.

19. A multiport memory according to claim 18, wherein said short circuit switch comprises a MIS type transistor.

20. A multiport memory according to claim 18, wherein the switches connected to a same a same one of said cells are formed almost of a same size.

21. A multiport memory according to claim 20, wherein said short-circuit switch is provided at an end of each bit line located outside of a cell region comprising said static memory cells.

22. A multiport memory according to claim 21, wherein said short-circuit switch comprises a MIS type transistor.

23. A multiport memory according to claim 22, wherein a mutual conductance Gm of the MIS type transistor forming said short-circuit switch is greater than a mutual conductance Gm of a MIS type transistor forming said switches.

24. A multiport memory, comprising:
   static memory cells;
   a first port and a second port provided for a write or a read operation to or from said static memory cells;
   first and second bit lines and first and second word lines having levels and provided corresponding to said first and second ports;
   switches for electrically connecting said bit lines corresponding to said first and second word lines of a same port to said static memory cells depending on the levels of said first and second word lines; and
   short-circuit devices for substantially short-circuiting the bit lines corresponding to the ports selected for the write operation and other selected bit lines among the first and second bit lines, when the first and second word lines belonging to a same row are selected from the read or the write operation;
   a row address matching detection circuit which compares row addresses input to respective ports with each other and outputs a signal when the row addresses of the ports including those selected for the write operation match;
   a first cell region and a second cell region which may be formed by dividing said word lines in a cell region of said static memory cells into two regions;
   a right row decoder provided between said first cell region and said second cell region, corresponding to a right port; and
   a left row decoder provided between said first cell region and said second cell region, corresponding to a left port; and
   said short-circuit devices receive an output of said row address matching detection circuit and generate a short-circuit of the bit lines corresponding to the ports selected for the write operation and other selected bit lines, among the bit lines corresponding to the respective ports.

25. A multiport memory according to claim 24, wherein said switching devices comprise a MIS type transistor.

26. A multiport memory according to claim 24, wherein the switches corresponding to a same port and belonging to a same column are formed almost of a same size.

27. A multiport memory according to claim 26 further comprising:
   a data bus line provided corresponding to each port;
   a column selecting transistor formed to enable electrical connection of said cells with said bit lines corresponding to the same port to which said data bus line also corresponds;
   a first load circuit formed to enable said bit lines to be maintained at a predetermined voltage; and
   a second load circuit formed to enable said data bus line to be maintained at the predetermined voltage.

28. A multiport memory according to claim 26, wherein said short-circuit devices comprise a short-circuit switch at an end of each bit line located outside of a cell region comprising said static memory cells.

29. A multiport memory according to claim 26, wherein said short-circuit switch comprises a MIS type transistor.

30. A multiport memory according to claim 29, wherein a mutual conductance gm of the MIS type transistor forming said short-circuit switch is greater than a mutual conductance of a MIS type transistor forming an said switches.

31. A multiport memory according to claim 1, further comprising:
   data bus lines provided corresponding to each port;
   a column selected transistor formed to enable electrical connection between said bit lines corresponding to the same port to which said data bus also corresponds;
   a first load circuit formed to enable said bit line to be maintained at a predetermined voltage; and
   a second load circuit formed to enable said data bus line to be maintained at the predetermined voltage.

32. A multiport memory, comprising:
   static memory cells arranged in an array of rows and columns and having at least two independent bit lines corresponding to at least two ports providing cell addresses; and
   a short circuit device coupled to the independent bit lines and to receive the cell addresses and short circuit connecting between the bit lines of corresponding columns at a time that the cell addresses match.

33. A memory as recited in claim 31, wherein said short circuit device comprises:
   a row address matching circuit adapted to receive the cell addresses; and
   a short circuit transistor connected to said row address matching circuit and between one of the two bit lines and one of the other bit lines.

* * * * *

UNITED STATES PATENT AND TRADEMARK OFFICE
CERTIFICATE OF CORRECTION

PATENT NO. : 5,335,199
DATED : August 2, 1994
INVENTOR(S) : KEIZO AOYAMA

It is certified that error appears in the above-indentified patent and that said Letters Patent is hereby corrected as shown below:

Column 1, line 49, delete "a," and substitute --, a--.

Column 2, line 26, delete "column" and after "right" insert --column--;

line 52, after "heavier" insert --corresponding to an--;

line 53, delete "corresponding to an";

line 68, after "($BL_R$" insert space.

Column 3, line 31, delete "i s" and substitute --is--;

line 64, delete "$DB_R$" (second occurrence) and substitute $$\overline{DB}_R$$

UNITED STATES PATENT AND TRADEMARK OFFICE
CERTIFICATE OF CORRECTION

PATENT NO. : 5,335,199

DATED : August 2, 1994

INVENTOR(S) :
KEIZO AOYAMA

It is certified that error appears in the above-indentified patent and that said Letters Patent is hereby corrected as shown below:

Column 4, line 11, after $IN_R$" insert --and--;

line 68, after "level" insert --.--.

Column 5, line 12, "$BL_L$" (second occurrence) should be $$\overline{BL_L}$$

* line 52, delete "the" (1st. occurrence).

Column 6, line 10, "lines" should be --pairs-- and after "bus" insert --lines--;

line 11, "extends" should be --extend--.

* Column 7, line 1, "follow" should --follows--.

UNITED STATES PATENT AND TRADEMARK OFFICE
CERTIFICATE OF CORRECTION

PATENT NO. : 5,335,199

DATED : August 2, 1994

INVENTOR(S) :
KEIZO AOYAMA

Page 3 of 4

It is certified that error appears in the above-indentified patent and that said Letters Patent is hereby corrected as shown below:

Column 8, line 13, after "where" insert --there--;

line 14, after "memory" insert --the--;

line 15, "Only" should be --One--;

lines 24 and 25, "inputted" should be --insert--.

Column 10, line 26, after "circuit" and "example" insert --,--;

line 39, delete "in the".

\* Column 11, line 40, after "solved" insert --.--.

\* Column 12, line 39, "formed" should be --form--;

line 45, after "structure" insert --allowing--;

line 49, after "eliminating" insert --an--.

UNITED STATES PATENT AND TRADEMARK OFFICE
CERTIFICATE OF CORRECTION

PATENT NO. : 5,335,199
DATED : August 2, 1994
INVENTOR(S) : Keizo Aoyama

It is certified that error appears in the above-indentified patent and that said Letters Patent is hereby corrected as shown below:

Column 15, line 11, delete "a same" (1st. occurrence).

Signed and Sealed this

First Day of November, 1994

Attest:

BRUCE LEHMAN

Attesting Officer

Commissioner of Patents and Trademarks